(12) United States Patent
Jung et al.

(10) Patent No.: US 8,986,783 B2
(45) Date of Patent: Mar. 24, 2015

(54) METHOD OF FORMING THIN FILM FROM MULTIPLE DEPOSITION SOURCES

(75) Inventors: Suk-Won Jung, Yongin (KR); Seung-Ho Choi, Yongin (KR); Kang-Il Lee, Yongin (KR); Hyun-Keun Song, Yongin (KR); Cheol-Lae Roh, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1065 days.

(21) Appl. No.: 12/926,587

(22) Filed: Nov. 29, 2010

(65) Prior Publication Data

US 2011/0129595 A1 Jun. 2, 2011

(30) Foreign Application Priority Data

Nov. 30, 2009 (KR) .................. 10-2009-0116421

(51) Int. Cl.
| | |
|---|---|
| C23C 16/448 | (2006.01) |
| C23C 14/24 | (2006.01) |
| H01L 51/00 | (2006.01) |
| H01L 51/56 | (2006.01) |

(52) U.S. Cl.
CPC ............... *C23C 14/243* (2013.01); *C23C 14/24* (2013.01); *H01L 51/001* (2013.01); *H01L 51/56* (2013.01)
USPC .................................. 427/248.1; 427/255.28

(58) Field of Classification Search
CPC ...................................................... C23C 16/448
USPC ............................. 427/248.1, 255.23, 255.28
See application file for complete search history.

(56) References Cited

U.S. PATENT DOCUMENTS

| | | | | |
|---|---|---|---|---|
| 4,197,814 | A | * | 4/1980 | Takagi et al. .................. 118/726 |
| 4,902,572 | A | * | 2/1990 | Horne et al. ................... 428/409 |
| 5,614,273 | A | * | 3/1997 | Goedicke et al. ............. 427/569 |
| 6,261,694 | B1 | * | 7/2001 | Iacovangelo .................. 428/412 |
| 6,451,692 | B1 | | 9/2002 | Derderian et al. |

(Continued)

FOREIGN PATENT DOCUMENTS

| | | |
|---|---|---|
| CN | 1924081 A | 3/2007 |
| CN | 101280417 A | 10/2008 |

(Continued)

OTHER PUBLICATIONS

Steigerwald, D.A., et al., "Two simple metal vapor deposition sources for downward evaporation in ultrahigh vacuum". J. Vac. Sci. Technol. A 7 (5), Sep./Oct. 1989, pp. 3123-3124.*

*Primary Examiner* — Bret Chen
(74) *Attorney, Agent, or Firm* — Lee & Morse, P.C.

(57) ABSTRACT

A method of depositing a material on a substrate is provided for use in manufacturing electronic and display devices such as semiconductors, liquid crystal displays, and organic light emitting diode displays. A deposition material stored in a first deposition source section is heated to evaporate the deposition material. A second deposition source section, which is separate from the first deposition source section, is cooled. The first deposition source section is cooled, and deposition material stored in a second deposition source section is heated so as to alternately supply evaporated deposition material from the first and second deposition source sections to a feed section. The evaporated deposition material from the feed section is supplied to a nozzle section. A substrate can be provided to receive the evaporated deposition material from the nozzle section. A thin film of deposition material can then be formed on the substrate.

11 Claims, 2 Drawing Sheets

(56) References Cited

U.S. PATENT DOCUMENTS

| | | | |
|---|---|---|---|
| 2002/0081447 A1* | 6/2002 | Movchan et al. | 428/469 |
| 2003/0207031 A1* | 11/2003 | Strangman et al. | 427/255.32 |
| 2004/0112289 A1* | 6/2004 | Moriya et al. | 118/715 |
| 2005/0000444 A1* | 1/2005 | Hass et al. | 118/723 EB |
| 2007/0054049 A1* | 3/2007 | Lindfors et al. | 427/248.1 |
| 2008/0216749 A1* | 9/2008 | Aulbach | 118/726 |
| 2009/0280249 A1* | 11/2009 | Takahashi | 427/255.28 |
| 2009/0324828 A1* | 12/2009 | Kato et al. | 427/255.28 |
| 2013/0129938 A1* | 5/2013 | Hass | 427/569 |
| 2013/0337174 A1* | 12/2013 | Goebert et al. | 427/255.395 |

FOREIGN PATENT DOCUMENTS

| | | |
|---|---|---|
| JP | 58-190815 | * 11/1983 |
| JP | 05-132761 A | 5/1993 |
| JP | 2005-281808 A | 10/2005 |
| JP | 2006-161074 A | 6/2006 |
| JP | 2006-188763 A | 7/2006 |
| JP | 2006-348369 A | 12/2006 |
| JP | 2007-227501 A | 9/2007 |
| JP | 2008-075095 A | 4/2008 |
| JP | 2008-088490 A | 4/2008 |
| JP | 2008-169456 A | 7/2008 |
| JP | 2008-169457 A | 7/2008 |
| KR | 10-2004-0105957 A | 12/2004 |
| KR | 10-2006-0006560 A | 1/2006 |
| KR | 10-2006-0035308 A | 4/2006 |
| KR | 10-2006-0087916 A | 8/2006 |
| KR | 10-2007-0024519 A | 3/2007 |
| KR | 10-0726136 B1 | 6/2007 |
| KR | 10-0926437 B1 | 11/2009 |
| TW | 301014 B | 3/1997 |
| TW | 1263690 B | 10/2006 |
| TW | 200914635 A | 4/2009 |
| TW | 200925303 A | 6/2009 |
| WO | WO 2009/107733 A1 | 9/2009 |

* cited by examiner

METHOD OF FORMING THIN FILM FROM MULTIPLE DEPOSITION SOURCES

BACKGROUND

1. Field

Embodiments relate to a deposition source, a deposition apparatus having the deposition source, and a method of forming a thin film.

2. Description of the Related Art

In general, deposition apparatuses are used to deposit thin films of various electronic parts, e.g., electronic and display devices such as semiconductors, liquid crystal displays (LCDs), and organic light emitting diode (OLED) display devices.

For example, the OLED display device may include an organic emission layer formed by depositing an anode, one or more organic thin films, and a cathode on a substrate. The organic thin films may be formed in a high-vacuum chamber by a thermal deposition process. For example, the substrate may be placed at an upper portion of the high-vacuum chamber, and a deposition source may be provided at a lower portion of the high-pressure vacuum chamber. A powdered organic material contained in a crucible of the deposition source may be evaporated, the evaporated organic material being scattered in a gas form under high vacuum, and thus adhered to the substrate. The adhered organic material may be solidified to form a thin film on the substrate.

SUMMARY

Embodiments are therefore directed to a deposition source, a deposition apparatus having the deposition source, and a method of forming a thin film, which substantially overcome one or more of the problems due to the limitations and disadvantages of the related art.

It is therefore a feature of an embodiment to provide a deposition source capable of cooling a crucible that is not used for deposition, in order to prevent a deposition material from being degraded by heat and increase efficiency of use of the deposition material, and also provide a deposition apparatus having the deposition source and a method of forming a thin film.

At least one of the above and other features and advantages may be realized by providing a deposition source, including a first deposition source section, the first deposition source section being configured to store a deposition material, a second deposition source section, the second deposition source section being separate from the first deposition source section and being configured to store the deposition material, the first and second deposition source sections being configured to alternately supply the deposition material while heating or cooling the deposition material, a feed section configured to receive evaporated deposition material from the first and second deposition source sections, and a nozzle section configured to receive the deposition material from the feed section.

The first deposition source section may be configured to heat the deposition material stored in the first deposition source section while the second deposition source section is being cooled, and the second deposition source section may be configured to heat the deposition material stored in the second deposition source section while the first deposition source section is being cooled.

The first deposition source section may include a first crucible configured to store the deposition material, a first heater on the first crucible, a first cooler on the first crucible, a first feed pipe, the first feed pipe connecting the first crucible with the feed section and the second deposition source section, and a first valve, the first valve being configured to open and close the first feed pipe so as to control flow communication between the first crucible and the feed section and the second deposition source section.

The second deposition source section may include a second crucible configured to store the deposition material, a second heater on the second crucible, a second cooler on the second crucible, a second feed pipe, the second feed pipe connecting the second crucible with the feed section and the first deposition source section, and a second valve, the second valve being configured to open and close the second feed pipe so as to control flow communication between the second crucible and the feed section and the first deposition source section.

The feed section may include a third feed pipe connected with the first deposition source section, the second deposition source section, and the nozzle section, and a third valve, the third valve being configured to open and close the third feed pipe so as to control flow communication with the nozzle section.

The nozzle section may include a body connected with the feed section, and at least one spray port installed on the body.

Flow communication between the first crucible and the second crucible may be controlled by the first and second valves, flow communication between the first crucible and the nozzle section may be controlled by the first and third valves, and flow communication between the second crucible and the nozzle section may be controlled by the second and third valves.

One of the first and second feed pipes may be in flow communication with the nozzle unit while a deposition process is under way, the other of the first and second feed pipes being isolated from the nozzle unit, and the third feed pipe may be in flow communication with the nozzle unit while the deposition process is under way.

The first deposition source section may be in flow communication with the second deposition source section after the deposition process is completed, the first and second deposition source sections being isolated from the nozzle unit while the first and second deposition source sections are in flow communication with each other.

At least one of the above and other features and advantages may also be realized by providing a deposition apparatus, including a deposition chamber, a first deposition source section, the first deposition source section being configured to store a deposition material, a second deposition source section, the second deposition source section being separate from the first deposition source section and being configured to store the deposition material, the first and second deposition source sections being configured to alternately supply the deposition material to the deposition chamber while heating or cooling the deposition material, a feed section configured to receive the deposition material from the first and second deposition source sections, and a nozzle section configured to receive the deposition material from the feed section, the nozzle section being configured to spray the deposition material into the deposition chamber.

The deposition apparatus may further include a mask having a pattern, the mask being disposed between a substrate and the nozzle section.

At least one of the above and other features and advantages may also be realized by providing a method of depositing a material on a substrate, the method including heating deposition material stored in a first deposition source section so as to evaporate the deposition material, cooling a second deposition source section, the second deposition source section being separate from the first deposition source section, cooling the first deposition source section and heating deposition material stored in a second deposition source section so as to alternately supply evaporated deposition material from the first and second deposition source sections to a feed section, and supplying the evaporated deposition material from the feed section to a nozzle section.

The method may further include providing a first substrate, the first substrate being arranged to receive the evaporated deposition material from the nozzle section, forming a thin film of the deposition material on the first substrate, removing the first substrate having the thin film thereon, and providing a second substrate after removing the first substrate, the second substrate being arranged to receive the evaporated deposition material from the nozzle section.

Evaporated deposition material may be provided from the first deposition source section to the second deposition source section while the first substrate is removed.

The first deposition source section may include a first crucible configured to store the deposition material, a first heater on the first crucible, a first cooler on the first crucible, a first feed pipe, the first feed pipe connecting the first crucible with the feed section and the second deposition source section, and a first valve, the first valve being configured to open and close the first feed pipe so as to control flow communication between the first crucible and the feed section and the second deposition source section, the second deposition source section may include a second crucible configured to store the deposition material, a second heater on the second crucible, a second cooler on the second crucible, a second feed pipe, the second feed pipe connecting the second crucible with the feed section and the first deposition source section, and a second valve, the second valve being configured to open and close the second feed pipe so as to control flow communication between the second crucible and the feed section and the first deposition source section, the feed section may include a third feed pipe connected with the first deposition source section, the second deposition source section, and the nozzle section, and a third valve, the third valve being configured to open and close the third feed pipe so as to control flow communication with the nozzle section, and providing the evaporated deposition material from the first deposition source section to the second deposition source section while the first substrate is removed may include opening the first and second valves while the third valve is closed.

When the second substrate is provided and the amount of deposition material stored in the first crucible is sufficient to form a thin film on the second substrate, the deposition material may be provided from the first crucible to the nozzle section through the first and third feed pipes.

The deposition material may be provided from the first crucible to the second substrate via the first and third feed pipes, the first and third valves being open, and the second valve may be closed to isolate the second crucible.

When the second substrate is provided and the amount of deposition material stored in the first crucible is exhausted or insufficient to form a thin film on the second substrate, the second cooler is stopped, the second crucible may be heated using the second heater to heat the deposition material stored in the second crucible, the first heater may be stopped, and the first crucible may be cooled using the first cooler.

Deposition material stored in the second crucible may be evaporated after the second crucible is heated, the deposition material being provided from the second crucible to the nozzle section through the second and third feed pipes.

Providing the deposition material from the second crucible to the nozzle section through the second and third feed pipes may include closing the first valve, and opening the second and third valves.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
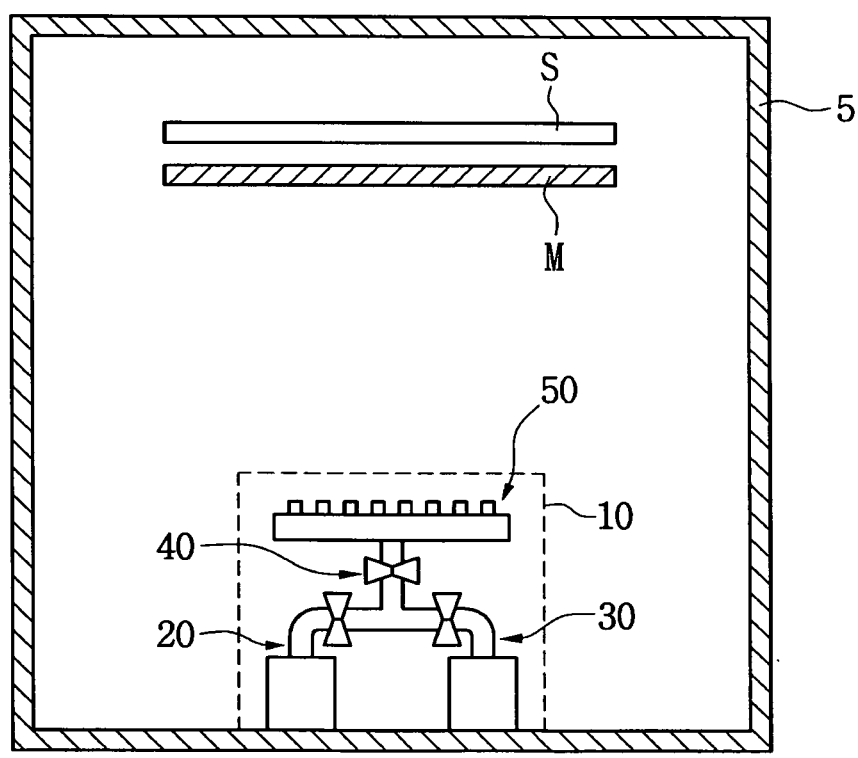
FIG. 1 illustrates a schematic view of a deposition apparatus according to an example embodiment.

Korean Patent Application No. 10-2009-0116421, filed on Nov. 30, 2009, in the Korean Intellectual Property Office, and entitled: "Deposition Source, Deposition Apparatus Having the Same, and Method of Forming Thin Film," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawing figures, the dimensions of layers and regions may be exaggerated for clarity of illustration. Like reference numerals refer to like elements throughout.

Figure 2:
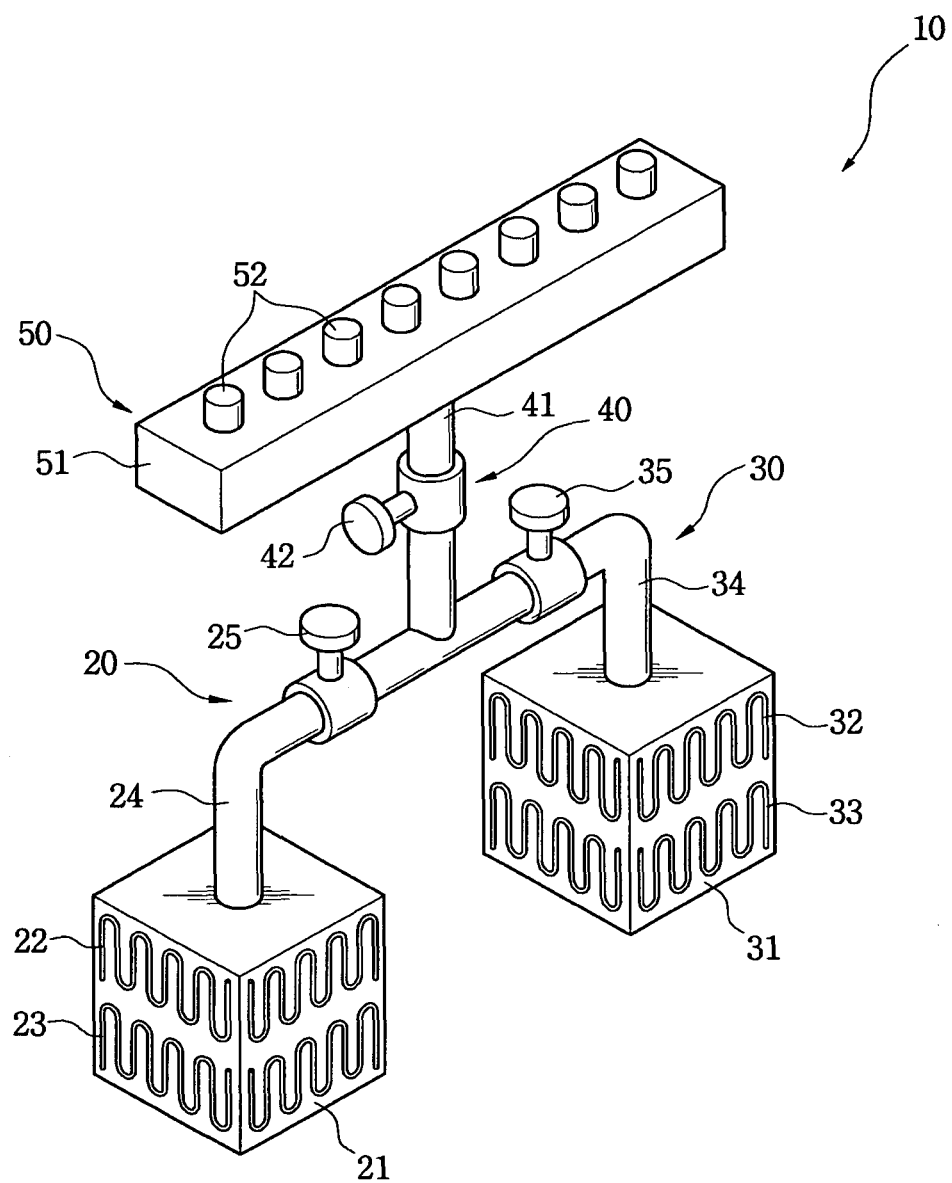
FIG. 2 illustrates a schematic view of a deposition source according to an example embodiment.

FIG. 1 illustrates a schematic view of a deposition apparatus according to an example embodiment, and FIG. 2 illustrates a schematic view of a deposition source according to an example embodiment.

Referring to FIGS. 1 and 2, the deposition apparatus 1 may include a chamber 5. The chamber 5 may be configured to receive a substrate S therein. The deposition apparatus 1 may also include a deposition source 10 for spraying a deposition material that is to be deposited on the substrate S. The substrate S and the deposition source 10 may be arranged so as to be opposite to each other. For example, as illustrated in FIG. 1, the substrate S may be located at an inner upper portion of the chamber 5, and the deposition source 10 may be located at an inner lower portion of the chamber 5.

The chamber 5 may be evacuated. For example, the interior of the chamber 5 may be kept under vacuum by a vacuum pump (not shown).

A mask M having a pattern thereon may be disposed between the substrate S and the deposition source 10. A deposition material may be deposited on the substrate S according to the pattern of the mask M.

The deposition source 10 may include a plurality of deposition sources, e.g., a first deposition source section 20 and a second deposition source section 30. The deposition source 10 may also include a feed section 40 and a nozzle section 50.

Both the first deposition source section 20 and the second deposition source section 30 may store the deposition material. The first deposition source section 20 and the second deposition source section 30 may alternately supply the deposition material. The first deposition source section 20 and the second deposition source section 30 may each be configured to both evaporate and cool the deposition material stored therein.

When the first deposition source section 20 supplies the deposition material, the second deposition source section 30 may be isolated, i.e., it may not supply the deposition material. When the second deposition source section 30 supplies the deposition material, the first deposition source section 20 may not supply the deposition material.

Depending on the process environment, the deposition material may be stored in both the first deposition source section 20 and the second deposition source section 30. In another implementation, the deposition material may be initially stored in only one of the first and second deposition source sections 20 and 30. The first and second deposition source sections 20 and 30 may be configured to move the deposition material between one another, e.g., bidirectionally, e.g., during a period when substrates are being loaded/unloaded.

The deposition material may include, e.g., a metal, an organic material, an inorganic material, etc. For example, the deposition material may include a material for forming an organic layer of an organic light emitting diode (OLED).

The first deposition source section 20 may include a first crucible 21 in which the deposition material is stored, and a first heater 22 and a first cooler 23, both of which are installed in the first crucible 21. The first heater 22 may supply heat to the first crucible 21, thereby heating the first crucible 21. The first cooler 23 may absorb the heat from the first crucible 21, thereby cooling the first crucible 21. Thus, the first heater 22 may heat the first crucible 21, or the first cooler 23 may cool the first crucible 21, so that the deposition material stored in the first crucible 21 is heated or cooled.

The first deposition source section 20 may include a first feed pipe 24 connecting the first crucible 21 to the feed section 40 and connecting the first crucible 21 the second deposition source section 30. The first deposition source section 20 may include a first valve 25 installed on the first feed pipe 24 and configured to control the movement of the deposition material passing through the first feed pipe 24.

The first heater 22 may be configured such that a heating means surrounds the first crucible 21. The heating means may include a heating wire.

The first cooler 23 may be configured such that a cooling means surrounds the first crucible 21. The cooling means may include a cooling line through which cooling gas or water flows.

To efficiently heat or cool the first crucible 21, the first heater 22 is preferably formed to not overlap with the first cooler 23.

The second deposition source section 30 may include a second crucible 31 in which the deposition material is stored, and a second heater 32 and a second cooler 33, both of which are installed in the second crucible 31. The second heater 32 may supply heat to the second crucible 31, thereby heating the second crucible 31. The second cooler 33 may absorb the heat from the second crucible 31, thereby cooling the second crucible 31.

The second heater 32 may heat the second crucible 31, or the second cooler 33 may cool the second crucible 31, so that the deposition material stored in the second crucible 31 is heated or cooled.

The second deposition source section 30 may include a second feed pipe 34 connecting the second crucible 31 to the feed section 40 and the connecting the second crucible 31 to the first deposition source section 20. The second deposition source section 30 may include a second valve 35 installed on the second feed pipe 34 and controlling the movement of the deposition material passing through the second feed pipe 34.

The second heater 32 may be configured such that a heating means surrounds the second crucible 31. The heating means may include a heating wire.

The second cooler 33 may be configured such that a cooling means surrounds the second crucible 31. The cooling means may include a cooling line through which cooling gas or water flows.

To efficiently heat or cool the second crucible 31, the second heater 32 is preferably formed to not overlap with the second cooler 33.

The feed section 40 may be connected to the first deposition source section 20, the second deposition source section 30, and the nozzle section 50, and may function as a passage through which the deposition material provided from the first deposition source section 20 and/or the second deposition source section 30 flows. The deposition material may be supplied to the nozzle section 50 through the feed section 40. Further, the deposition material may be supplied from the first deposition source section 20 to the second deposition source section 30 (and/or from the second deposition source section 30 to the first deposition source section 20) through a flow path that is coupled by a "T" to part of the feed section 40.

The feed section 40 may include a third feed pipe 41 connecting each of the first and second deposition source sections 20 and 30 with the nozzle section 50. The feed section 40 may include a third valve 42 installed on the third feed pipe 41, the third valve 42 controlling the movement of the deposition material (provided from first and/or second deposition source sections 20, 30) to the nozzle section 50.

The first feed pipe 24 of the first deposition source section 20, the second feed pipe 34 of the second deposition source section 30, and the third feed pipe 41 of the feed section 40 may be connected to each other. Flow communication may be controlled by way of operation of one or more of the respective valves 25, 35, 42.

The nozzle section 50 may be connected with the feed section 40, and may function to spray the evaporated deposition material, which is provided from the feed section 40, into the chamber 5, e.g., onto the substrate S via the mask M. The nozzle section 50 may include a body 51 connected with the feed section 40, and at least one spray port 52 installed on the body 51.

A method of depositing a deposition material on the substrate S and forming a thin film using the deposition apparatus 1 shown in FIG. 1 will now be described. For the purposes of the following description, it is assumed that the first deposition source section 20 supplies the deposition material first. Further, it is assumed that the first deposition source section 20 initially stores the deposition material, whereas the second deposition source section 30 does not initially store the deposition material. However, embodiments are not limited to this order of operations.

Initially, when the substrate S is located in the chamber 5, the chamber 5 may be kept under vacuum by the vacuum pump.

When the deposition material is to be deposited, the first deposition source section 20 may supply the deposition material to the nozzle section 50 through the feed section 40, and the second deposition source section 30 may be isolated, i.e., may not supply the deposition material.

For example, when the first heater 22 heats the first crucible 21, the deposition material stored in the first crucible 21 may be evaporated by heat so that the evaporated deposition material moves along the first feed pipe 24. The deposition material moving along the first feed pipe 24 may be supplied to the nozzle section 50 through the third feed pipe 41 of the feed section 40.

The nozzle section 50 may spay the deposition material toward the substrate S. The sprayed deposition material may be deposited on the substrate S through the mask M, so that a thin film having a pattern corresponding to the mask M is formed on the substrate S.

At this time, the first valve 25 of the first deposition source section 20 may be kept open, such that the first feed pipe 24 is opened, i.e., is in flow communication. The third valve 42 of the feed section 40 may also be kept open such that the third feed pipe 41 is opened.

In the meantime, the second valve 35 of the second deposition source section 30 may be kept closed such that the second feed pipe 34 is closed. Thus, the deposition material may be prevented from moving along the second feed pipe 34.

Further, during deposition from the first deposition source section 20, the second crucible 31 may be cooled by operation of the second cooler 33, so that the second deposition source section 30 can be kept cool.

When the deposition onto the substrate S is completed, the substrate S having the thin film thereon may be unloaded from the chamber 5 and a new substrate S on which a thin film is to be formed may be loaded into the chamber 5.

While the substrates are being unloaded and loaded, the open state of the first and third valves 25 and 42 and the closed state of the second valve 35, i.e., the valve state for the deposition, may be changed such that the first and second valves 25 and 35 are kept open, and the third valve 42 is kept closed. In this configuration, the deposition material supplied from the first deposition source section 20 does not move to the nozzle section 50, but instead moves to the second deposition source section 30.

As described above, flow communication may be provided from the first deposition source section 20 to the second deposition source section 30 during a period when substrate deposition is not occurring. When the second deposition source section 30 is cooled, the deposition material evaporated by heat from the first crucible 21 may be collected and stored in the second crucible 31. The deposition material may be in a powder form when cooled. Thus, evaporated deposition material may be stored, e.g., as a powder, in the second crucible 31 while the deposition of material is not being performed. Thus, it may be possible to reduce or prevent the deposition material from being degraded by heat, and to increase efficiency of use of the deposition material.

When the unloading and loading of the substrates S are completed, the deposition process may be carried out again to form a thin film on the second-loaded substrate S. If the amount of deposition material stored in the first crucible 21 is sufficient, the third valve 42 may be opened so that the deposition material is supplied from the first deposition source section 20 to the nozzle section 50 through the feed section 40.

In contrast, if the amount of deposition material stored in the first crucible 21 is insufficient or exhausted, the first valve 25 may be closed, and the second valve 35 and the third valve 42 may be opened.

To cool the first crucible 21, the first deposition source section 20 may be configured such that the operation of the first heater 22 is stopped and the operation of the first cooler 23 is started. To heat the second crucible 31, the second deposition source section 30 may be configured such that the operation of the second cooler 33 is stopped and the operation of the second heater 32 is started.

Thus, the second crucible 31 may be heated by the operation of the second heater 32, and the deposition material stored in the second crucible 31 may be evaporated and supplied to the nozzle section 50 through the feed section 40. The nozzle section 50 may spray the deposition material toward the substrate S, and the sprayed deposition material may be deposited on the substrate S through the mask M to form the thin film.

The deposition operations, including the exchange of deposition material between the first and second deposition source sections 20 and 30, may be repeated until the deposition material stored in the first and second deposition source sections 20 and 30 is exhausted or insufficient to form any more thin films.

As described above, embodiments relate to a deposition source capable of preventing a deposition material from being modified or degraded by heat and increasing efficiency of use of the deposition material, as well as a deposition apparatus having the deposition source and a method of forming a thin film. An evaporated deposition material may be stored in a cooled crucible while the deposition is not being carried out, and may be resupplied from the cooled crucible to the substrate by a subsequent heating cycle.

The deposition sources may each be equipped with a crucible therein and a hot wire heater therearound. When the hot wire heater is powered by electrical energy, its heating wire is resistance-heated to emit radiant heat and the crucible may be heated using this infrared radiant heat. The deposition sources may be configured to act as a linear deposition source, which may be used to uniformly deposit material on a large area of substrate. For example, the linear deposition source may be installed in a lengthwise direction such that its size corresponds to a size of the substrate.

To improve the low material usage efficiency that is an advantage of the linear deposition source, the crucibles may be separated from the deposition nozzle unit, and a cutoff valve may be applied between the crucibles and the deposition nozzle unit. The cutoff valve may be opened only to carry out the deposition. Closing the cutoff valve may help prevent waste of the deposition material and extend the period between maintenance operations. Further, while the cutoff valve is closed, an increased pressure in the crucible may be avoided, thus reducing or preventing degradation of the deposition material therein, by placing the heated crucible in flow communication with another crucible that is cooled. This may help avoid degradation of the deposition material during the deposition operations, and thereby improve the yield and reliability of the deposition apparatus and operations.

Example embodiments have been disclosed herein, and although specific terms are employed, they are used and are to be interpreted in a generic and descriptive sense only and not for purpose of limitation. For example, the respective deposition source sections may supply evaporated deposition source material to respective substrates (e.g., such that a first substrate receives evaporated deposition material that is provided from the first deposition source section, and a second substrate receives evaporated deposition material that is provided from the second deposition source section), or may each supply evaporated deposition source material to a series of substrates, or a combination thereof. Accordingly, it will be understood by those of ordinary skill in the art that various changes in form and details may be made without departing from the spirit and scope of the present invention as set forth in the following claims.

What is claimed is:

1. A method of depositing a material on a substrate, the method comprising:

heating deposition material stored in a first deposition source section so as to evaporate the deposition material;

cooling a second deposition source section, the second deposition source section being separate from the first deposition source section;

cooling the first deposition source section and heating deposition material stored in the second deposition source section so as to alternately supply evaporated deposition material from the first and second deposition source sections to a feed section;

supplying the evaporated deposition material from the feed section to a nozzle section;

providing a first substrate, the first substrate being arranged to receive the evaporated deposition material from the nozzle section; and forming a thin film of the deposition material on the first substrate.

2. The method as claimed in claim 1, further comprising:
removing the first substrate having the thin film thereon; and
providing a second substrate after removing the first substrate, the second substrate being arranged to receive the evaporated deposition material from the nozzle section.

3. The method as claimed in claim 2, wherein evaporated deposition material is provided from the first deposition source section to the second deposition source section while the first substrate is removed.

4. The method as claimed in claim 3, wherein:
the first deposition source section includes:
  a first crucible configured to store the deposition material;
  a first heater on the first crucible;
  a first cooler on the first crucible;
  a first feed pipe, the first feed pipe connecting the first crucible with the feed section and the second deposition source section; and
  a first valve, the first valve being configured to open and close the first feed pipe so as to control flow communication between the first crucible and the feed section and the second deposition source section,
the second deposition source section includes:
  a second crucible configured to store the deposition material;
  a second heater on the second crucible;
  a second cooler on the second crucible;
  a second feed pipe, the second feed pipe connecting the second crucible with the feed section and the first deposition source section; and
  a second valve, the second valve being configured to open and close the second feed pipe so as to control flow communication between the second crucible and the feed section and the first deposition source section,
the feed section includes:
  a third feed pipe connected with the first deposition source section, the second deposition source section, and the nozzle section; and
  a third valve, the third valve being configured to open and close the third feed pipe so as to control flow communication with the nozzle section, and
providing the evaporated deposition material from the first deposition source section to the second deposition source section while the first substrate is removed includes opening the first and second valves while the third valve is closed.

5. The method as claimed in claim 4, wherein, when the second substrate is provided and the amount of deposition material stored in the first crucible is sufficient to form a thin film on the second substrate, the deposition material is provided from the first crucible to the nozzle section through the first and third feed pipes.

6. The method as claimed in claim 5, wherein the deposition material is provided from the first crucible to the second substrate via the first and third feed pipes, the first and third valves being open, and the second valve is closed to isolate the second crucible.

7. The method as claimed in claim 4, wherein, when the second substrate is provided and the amount of deposition material stored in the first crucible is exhausted or insufficient to form a thin film on the second substrate, the second cooler is stopped, the second crucible is heated using the second heater to heat the deposition material stored in the second crucible, the first heater is stopped, and the first crucible is cooled using the first cooler.

8. The method as claimed in claim 7, wherein deposition material stored in the second crucible is evaporated after the second crucible is heated, the deposition material being provided from the second crucible to the nozzle section through the second and third feed pipes.

9. The method as claimed in claim 8, wherein providing the deposition material from the second crucible to the nozzle section through the second and third feed pipes includes closing the first valve, and opening the second and third valves.

10. The method as claimed in claim 1, wherein the evaporated deposition material is provided from the first deposition source section to the second deposition source section.

11. The method as claimed in claim 10, wherein the evaporated deposition material is provided from the first deposition source section to the second deposition source section during a period when substrate deposition is not occurring.

* * * * *